United States Patent
Jennings et al.

(10) Patent No.: US 11,544,544 B2
(45) Date of Patent: Jan. 3, 2023

(54) SYSTEM ARCHITECTURE BASED ON SOC FPGA FOR EDGE ARTIFICIAL INTELLIGENCE COMPUTING

(71) Applicant: GOWN Semiconductor Corporation, Guangzhou (CN)

(72) Inventors: Grant Thomas Jennings, Austin, TX (US); Jianhua Liu, Guangzhou (CN)

(73) Assignee: GOWIN Semiconductor Corporation, Guangzhou (CN)

(*) Notice: Subject to any disclaimer, the term of this patent is extended or adjusted under 35 U.S.C. 154(b) by 404 days.

(21) Appl. No.: 16/740,505

(22) Filed: Jan. 13, 2020

(65) Prior Publication Data
US 2021/0081770 A1   Mar. 18, 2021

(30) Foreign Application Priority Data
Sep. 17, 2019  (CN) .......................... 201910875064.9

(51) Int. Cl.
*G06N 3/063*  (2006.01)
*G06N 3/08*  (2006.01)
*H03K 19/1776*  (2020.01)

(52) U.S. Cl.
CPC ............... *G06N 3/063* (2013.01); *G06N 3/08* (2013.01); *H03K 19/1776* (2013.01)

(58) Field of Classification Search
CPC ....... G06N 3/063; G06N 3/08; H03K 19/1776
See application file for complete search history.

(56) References Cited

U.S. PATENT DOCUMENTS

| 7,058,921 | B1 | 6/2006 | Hwang et al. |
| 7,509,614 | B2 | 3/2009 | Hwang et al. |
| 10,713,535 | B2* | 7/2020 | Chen ..................... G06N 3/0454 |
| 10,776,164 | B2* | 9/2020 | Zhao ..................... G06F 9/5011 |
| 10,805,179 | B2* | 10/2020 | Guim Bernat .......... H04L 67/12 |
| 11,100,607 | B2* | 8/2021 | Cho ........................ G06T 3/4046 |
| 11,119,820 | B2* | 9/2021 | Andrei ................ G06F 13/4282 |
| 11,256,977 | B2* | 2/2022 | Smelyanskiy .......... G06F 17/16 |

(Continued)

FOREIGN PATENT DOCUMENTS

| CA | 3092940 A1 * | 9/2019 | ......... G06F 21/6254 |
| CA | 3065651 A1 * | 10/2020 | .......... G06F 11/3058 |

(Continued)

OTHER PUBLICATIONS

CN 104820657—Machine Translated (Year: 2015).*

*Primary Examiner* — Berhanu Tadese
(74) *Attorney, Agent, or Firm* — True Shepherd LLC; Andrew C. Cheng

(57) ABSTRACT

A system architecture based on SoC FPGA for edge artificial intelligence computing includes an MCU subsystem and an FPGA subsystem. The FPGA subsystem includes: an accelerator for accelerating artificial intelligence algorithm; and a shared memory used as an interface between the accelerator and the MCU subsystem. The shared memory is configured to upload the data to be calculated and to retrieve the operation result; the accelerator is configured to read the data from the shared memory independently and to write back the operation result. The system architecture has the advantages of small hardware area, low power consumption, high computing performance and easy use, and the design process is simple and flexible.

3 Claims, 7 Drawing Sheets

(56) References Cited

U.S. PATENT DOCUMENTS

| | | | |
|---|---|---|---|
| 11,264,055 B2* | 3/2022 | Liu | G06F 11/14 |
| 11,295,412 B2* | 4/2022 | Lee | G06V 10/82 |
| 11,315,222 B2* | 4/2022 | Lee | G06T 5/002 |
| 11,322,179 B2* | 5/2022 | Liu | G11B 20/1879 |
| 11,373,099 B2* | 6/2022 | Guim Bernat | G06N 3/10 |
| 2004/0021085 A1 | 2/2004 | Prince et al. | |
| 2019/0140913 A1* | 5/2019 | Guim Bernat | G06N 3/105 |
| 2019/0317802 A1* | 10/2019 | Bachmutsky | G06F 9/5038 |
| 2020/0104670 A1* | 4/2020 | Seo | G06F 40/30 |
| 2020/0250510 A1* | 8/2020 | Kumar Addepalli | G06N 5/04 |
| 2020/0294182 A1* | 9/2020 | George | G06N 3/063 |
| 2020/0296221 A1* | 9/2020 | Zhou | H04M 15/66 |
| 2020/0364829 A1* | 11/2020 | Ahn | G06T 3/4046 |
| 2020/0382204 A1* | 12/2020 | Yu | H03M 13/09 |
| 2020/0387801 A1* | 12/2020 | Kwon | G06F 17/16 |
| 2021/0019591 A1* | 1/2021 | Venkatesh | G06N 3/04 |
| 2021/0019633 A1* | 1/2021 | Venkatesh | G06N 3/08 |
| 2021/0063214 A1* | 3/2021 | Li | G08B 21/0492 |
| 2021/0065891 A1* | 3/2021 | Li | A61B 5/1123 |
| 2021/0081770 A1* | 3/2021 | Jennings | G06N 3/08 |
| 2021/0273658 A1* | 9/2021 | Shen | H03M 13/09 |
| 2021/0274438 A1* | 9/2021 | Guan | H04B 7/088 |
| 2021/0303173 A1* | 9/2021 | Wu | G06F 3/0611 |
| 2021/0319098 A1* | 10/2021 | Pogorelik | G06N 3/04 |
| 2021/0327027 A1* | 10/2021 | Cho | G06F 3/14 |
| 2021/0337404 A1* | 10/2021 | Sun | H04W 24/04 |
| 2021/0342569 A1* | 11/2021 | Sieckmann | G06V 20/693 |
| 2021/0342636 A1* | 11/2021 | Sieckmann | G06V 20/698 |
| 2021/0344355 A1* | 11/2021 | Yu | H04L 1/0041 |
| 2021/0351815 A1* | 11/2021 | Zheng | H04W 72/0473 |
| 2021/0360437 A1* | 11/2021 | Zhu | H04B 7/088 |
| 2021/0377138 A1* | 12/2021 | Sun | H04L 43/0852 |
| 2021/0377588 A1* | 12/2021 | Lee | H04N 21/8106 |
| 2021/0377923 A1* | 12/2021 | Ge | H04W 72/0453 |
| 2021/0385723 A1* | 12/2021 | Zong | H04W 36/08 |
| 2022/0012520 A1* | 1/2022 | Mok | G06V 20/635 |
| 2022/0014299 A1* | 1/2022 | Ji | H04W 72/0446 |
| 2022/0022122 A1* | 1/2022 | Cao | H04W 40/36 |
| 2022/0061078 A1* | 2/2022 | Guan | H04W 72/0466 |
| 2022/0066812 A1* | 3/2022 | Du | H04L 67/5651 |
| 2022/0076375 A1* | 3/2022 | Lee | G06T 3/4046 |
| 2022/0086243 A1* | 3/2022 | Pang | H04L 67/51 |
| 2022/0086693 A1* | 3/2022 | Zhou | H04W 4/24 |
| 2022/0108724 A1* | 4/2022 | Liu | G06F 11/1076 |
| 2022/0109962 A1* | 4/2022 | Zhu | H04L 45/74 |
| 2022/0123881 A1* | 4/2022 | Li | H04L 5/0035 |

FOREIGN PATENT DOCUMENTS

| | | | | |
|---|---|---|---|---|
| CN | 102723764 A | * | 10/2012 | |
| CN | 102723764 B | * | 12/2014 | |
| CN | 104820657 A | * | 8/2015 | |
| CN | 104835162 A | | 8/2015 | |
| CN | 104866286 A | | 8/2015 | |
| CN | 207458128 U | | 6/2018 | |
| CN | 207458128 U | * | 6/2018 | |
| CN | 108256636 A | * | 7/2018 | G06F 30/20 |
| CN | 108536635 A | | 9/2018 | |
| CN | 109816220 A | * | 5/2019 | |
| CN | 109871353 A | * | 6/2019 | |
| CN | 110074776 A | * | 8/2019 | A61B 5/0006 |
| CN | 209514616 U | * | 10/2019 | |
| CN | 110477862 A | * | 11/2019 | A61B 5/02405 |
| CN | 110477864 A | * | 11/2019 | A61B 5/02405 |
| CN | 110489765 A | * | 11/2019 | |
| CN | 110727633 A | * | 1/2020 | G06N 3/063 |
| CN | 110074776 B | * | 4/2020 | A61B 5/0006 |
| CN | 111626401 A | * | 9/2020 | G06F 8/41 |
| CN | 111985597 A | * | 11/2020 | |
| CN | 112788990 A | * | 5/2021 | A61B 5/165 |
| CN | 112955909 A | * | 6/2021 | |
| DE | 112018006701 T5 | * | 9/2020 | G06N 5/04 |
| WO | WO-2019136747 A1 | * | 7/2019 | G06N 3/063 |
| WO | WO-2019136762 A1 | * | 7/2019 | G06N 3/063 |
| WO | WO-2019136764 A1 | * | 7/2019 | G06F 5/10 |
| WO | WO-2020067633 A1 | * | 4/2020 | A61B 5/165 |
| WO | WO-2020107481 A1 | * | 6/2020 | H04B 10/0791 |
| WO | WO-2020124867 A1 | * | 6/2020 | G06F 12/08 |
| WO | WO-2020133134 A1 | * | 7/2020 | G02B 6/447 |
| WO | WO-2020142871 A | * | 7/2020 | |
| WO | WO-2020142871 A1 | | 7/2020 | |
| WO | WO-2020150878 A1 | * | 7/2020 | H04L 12/4641 |
| WO | WO-2020155083 A1 | * | 8/2020 | |
| WO | WO-2021031015 A1 | * | 2/2021 | |
| WO | WO-2021031127 A1 | * | 2/2021 | |

\* cited by examiner

SYSTEM ARCHITECTURE BASED ON SOC FPGA FOR EDGE ARTIFICIAL INTELLIGENCE COMPUTING

CROSS-REFERENCE TO RELATED APPLICATIONS

This application claims priority to Chinese Patent Application No. 201910875064.9 with a filing date of Sep. 17, 2020. The content of the aforementioned application, including any intervening amendments thereto, is incorporated herein by reference.

FIELD

The exemplary embodiment(s) of the present invention relates to the field of artificial intelligence (AI) technology. More specifically, the exemplary embodiment(s) of the present invention relates to a system architecture based on system on chip (SoC) field programmable gate array (FPGA) for edge artificial intelligence computing (EAIC).

BACKGROUND

With the development and wide application of AI technology, AI Computing in different scenarios is facing more and more challenges. The application of AI Computing has gradually expanded from the cloud to the edge, such as the Internet of Things (IoT). The edge is the side close to the object or data source. For example, the edge of the IoT is a large number of sensors and cameras.

In the prior art, one of the solutions is to use pure microcontroller unit (MCU) to provide a fixed hardware structure. The scheme has the characteristics of small area and low power consumption. It is easy to use but has low computational performance. The other scheme uses fully customized hardware. The scheme can meet the requirements of computing performance, but it has high design cost, long cycle, high risk and poor usability. High-level synthesis platform based on FPGA can quickly implement specific algorithms in the field of FPGA, which is easy to use, but requires large-scale FPGA, and can not meet the area and power requirements of AI edge applications.

Therefore, how to customize an efficient hardware structure for a specific AI algorithm and implement the whole algorithm is also a huge challenge.

SUMMARY

The technical problem to be solved by the embodiment of the present invention is to provide a system architecture based on SoC FPGA for EAIC in view of at least one defect in the EAIC system in the prior art. The system architecture has the advantages of flexibility and high efficiency, which enables the developers of edge AI algorithms to quickly and easily implement low-cost, high-performance computing on SoC FPGA.

In order to solve the above technical problems, this application provides a system architecture based on SoC FPGA for EAIC, including an MCU subsystem and an FPGA subsystem. The FPGA subsystem includes: an accelerator for accelerating an AI algorithm; and a shared memory used as an interface between the accelerator and the MCU subsystem, wherein the MCU subsystem is configured to upload the data to be calculated to the shared memory and to retrieve an operation result; and the accelerator is configured to read the data from the shared memory independently and to write back the operation result.

In another aspect, the application also provides a compilation method for the system architecture based on SoC FPGA for EAIC, which includes: acquiring an AI model; optimizing an algorithm of the AI model to obtain the optimized algorithm; generating a customized accelerator; and according to a function of the accelerator, mapping the optimized algorithm to the MCU instruction set and operation instructions for the accelerator, and generating a software binary code and according to the function of the accelerator, compiling the IP core of the accelerator and the MCU by the FPGA to generate a hardware system.

In yet another aspect, the application also provides a computer-readable storage medium that stores computer instructions that enable the computer to execute the compilation method described above.

Implementing embodiments of the present invention has the following beneficial effects:

1. By cooperating the MCU subsystem with the FPGA subsystem, the invention provides customizable accelerator in the FPGA to accelerate the AI algorithm. On the one hand, it can reduce the power consumption and area of the system, and on the other hand, it can ensure that the system has enough high computing performance.

2. The present application realizes the interface between the accelerator and the MCU subsystem by the shared memory, guarantees that the accelerator provides a compatible and unified data path to the MCU, reduces data handling, and speeds up the data access speed of the accelerator.

3. In the present application, the accelerator function is added to the MCU-based AI compilation tool chain to match and invoke in the compilation process, which greatly facilitate the use of the system architecture.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
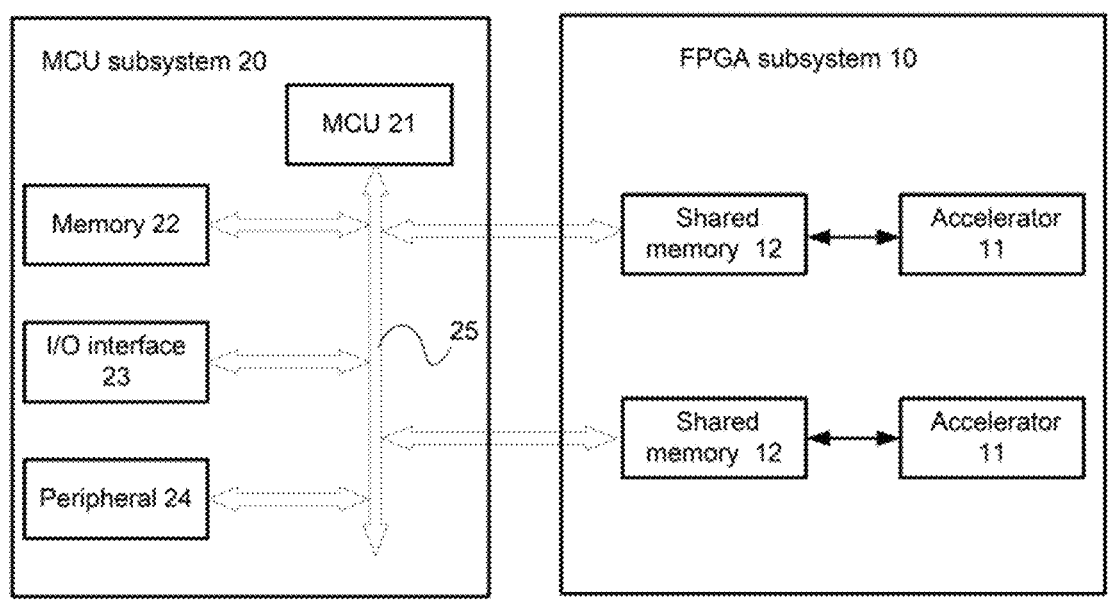
FIG. 1 is a block diagram of a system architecture based on SoC FPGA for EAIC according to the embodiment of the present application.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

As used in the description herein and throughout the claims that follow, the meaning of "a", "an", and "the" includes plural reference unless the context clearly dictates otherwise. Moreover, titles or subtitles may be used in the specification for convenience of a reader, which shall have no influence on the scope of the present disclosure. For convenience, certain terms may be highlighted, for example using italics and/or quotation marks. The use of highlighting has no influence on the scope and meaning of a term; the scope and meaning of a term is the same, in the same context, whether or not it is highlighted. Additionally, some terms used in this specification are more specifically defined below.

The term used in this specification generally have their ordinary meanings in the art, within the context of the disclosure, and in the specific context where each term is used. It will be appreciated that same thing can be said in more than one way. Consequently, alternative language and synonyms may be sued for any one or more of the terms discussed herein, nor is any special significance to be placed upon whether or not a term is elaborated or discussed herein.

As used herein, the terms "comprising," "including," "carrying," "having," "containing," "involving," and the like are to be understood to be open-ended, i.e., to mean including but not limited to.

As used herein, "plurality" means two or more.

System Architecture

FIG. 1 is a block diagram of the system architecture based on SoC FPGA for EAIC in accordance with one embodiment of the present application. The present application proposes to use the FPGA of the SoC FPGA as an accelerator for AI instructions and seamlessly connect the accelerator to the MCU system, so as to form an SoC system with customizable accelerator as a whole. The corresponding accelerator functions are added to the MCU-based AI compilation tool chain, and matched and invoked in the compilation process.

The system architecture includes an MCU subsystem 10 and an FPGA subsystem 20. A part of the resources in the FPGA subsystem 20 are used to realize the acceleration function of AI algorithm, which can be customized for each algorithm application. Such a specific algorithm can be implemented by the MCU and the accelerator together.

The FPGA subsystem 20 includes: an accelerator 11 for accelerating AI algorithms; and a shared memory 12 used as an interface between the accelerator 11 and the MCU subsystem 20. The MCU subsystem 20 uploads the data to be calculated to the shared memory 12 and retrieves the operation results; and the accelerator 11 reads the data independently from the shared memory 12 and writes back the operation results.

Only by downloading the key calculation to the accelerator, the system architecture of the present application can achieve the maximum acceleration under the condition of the lowest power consumption/minimum area. The system architecture of the present application also takes into account the requirements of ease of use. The system architecture of the present application not only has low cost, but also can provide seamless high-level user interface for algorithm/software developers without professional software.

Figure 2:
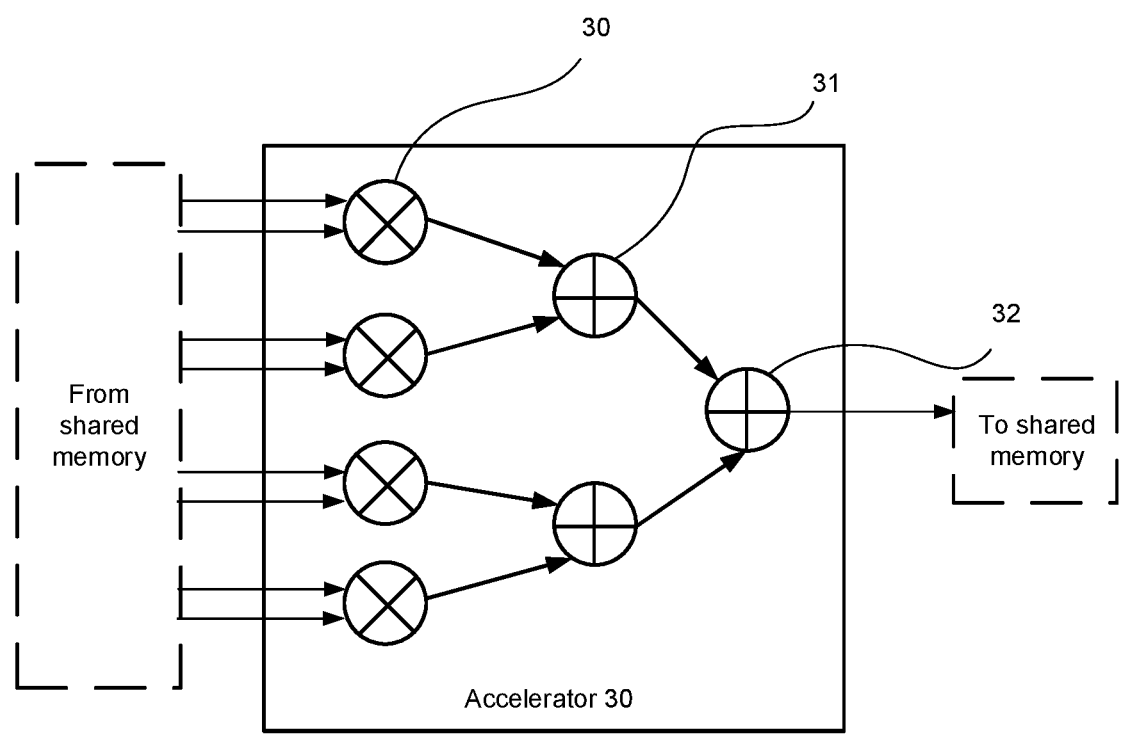
FIG. 2 is a schematic diagram of an adder shown in FIG. 1 according to one embodiment of the present application.
Figure 3:
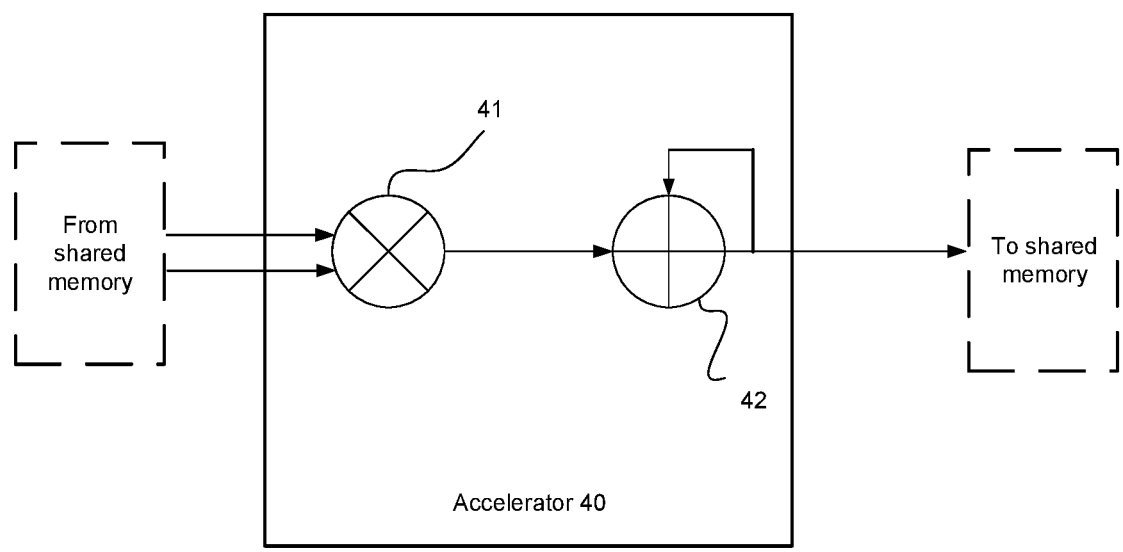
FIG. 3 is a schematic diagram of the adder shown in FIG. 1 according to another embodiment of the present application.

Specifically, the accelerator 11 is one or more. The accelerator 11 can have a variety of flexible functions and implementations. For example, as shown in FIG. 2, in one embodiment, the accelerator 30 may be a high-performance parallel convolution operation consisting of multiple digital signal processor (DSP) modules, including multiple multipliers 31 and multiple adders 32. In another embodiment, as shown in FIG. 3, the accelerator 40 may also be a multi-clock cycle cumulative convolution operation by a few or a single DSP, including a multiplier 41 and a cyclic accumulator 42.

The shared memory 12 corresponds to the accelerator 11 one by one. The interface between each accelerator 11 and the MCU subsystem 20 is implemented by sharing storage with the MCU subsystem. As shown in FIG. 1, the MCU subsystem 20 includes an MCU 21, a memory 22, an input and output interface 23, a bus 25 and/or a peripheral 24. The MCU 21 uploads data to the shared memory 12 and retrieves the results. The accelerator 11 independently reads data from the shared memory 12 and writes back the operation results. The shared memory 12 is configured to provide separate address spaces or index methods for the MCU 22 and the accelerator 11.

Figure 4:
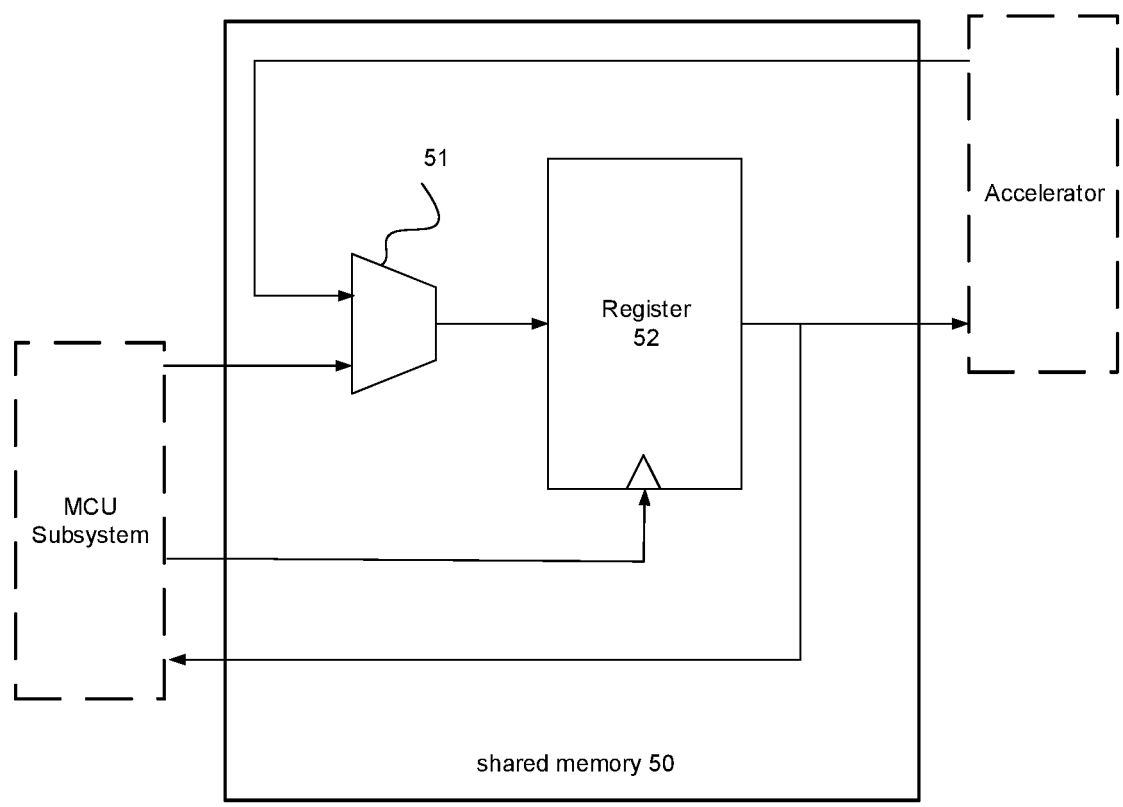
FIG. 4 is a schematic diagram of a shared memory shown in FIG. 1 according to one embodiment of the present application.
Figure 5:
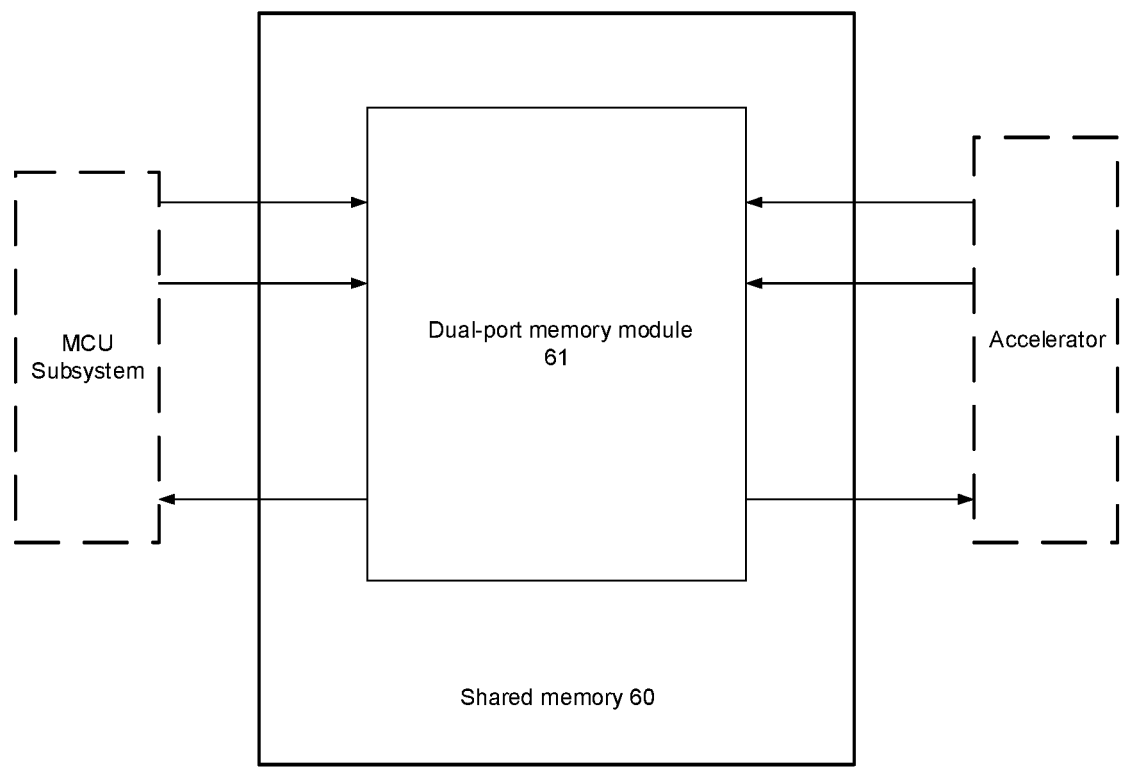
FIG. 5 is a schematic diagram of the shared memory shown in FIG. 1 according to another embodiment of the present application.

Further, the shared memory 12 is a register or a multi-port memory module in the FPGA subsystem 10. For example, as shown in FIG. 4, in one embodiment, the shared memory 50 includes a multiplexer 51 and a register 52. As shown in FIG. 5, in another embodiment, the shared memory 60 includes a dual-port memory module 61. The shared memory can also be used as other forms of memory, which is not limited here.

The FPGA subsystem 10 includes an FPGA chip. In addition to the accelerator 11 and the shared memory 12, there are other functional modules in the FPGA subsystem, which are not limited here.

Compilation Method

Figure 6:
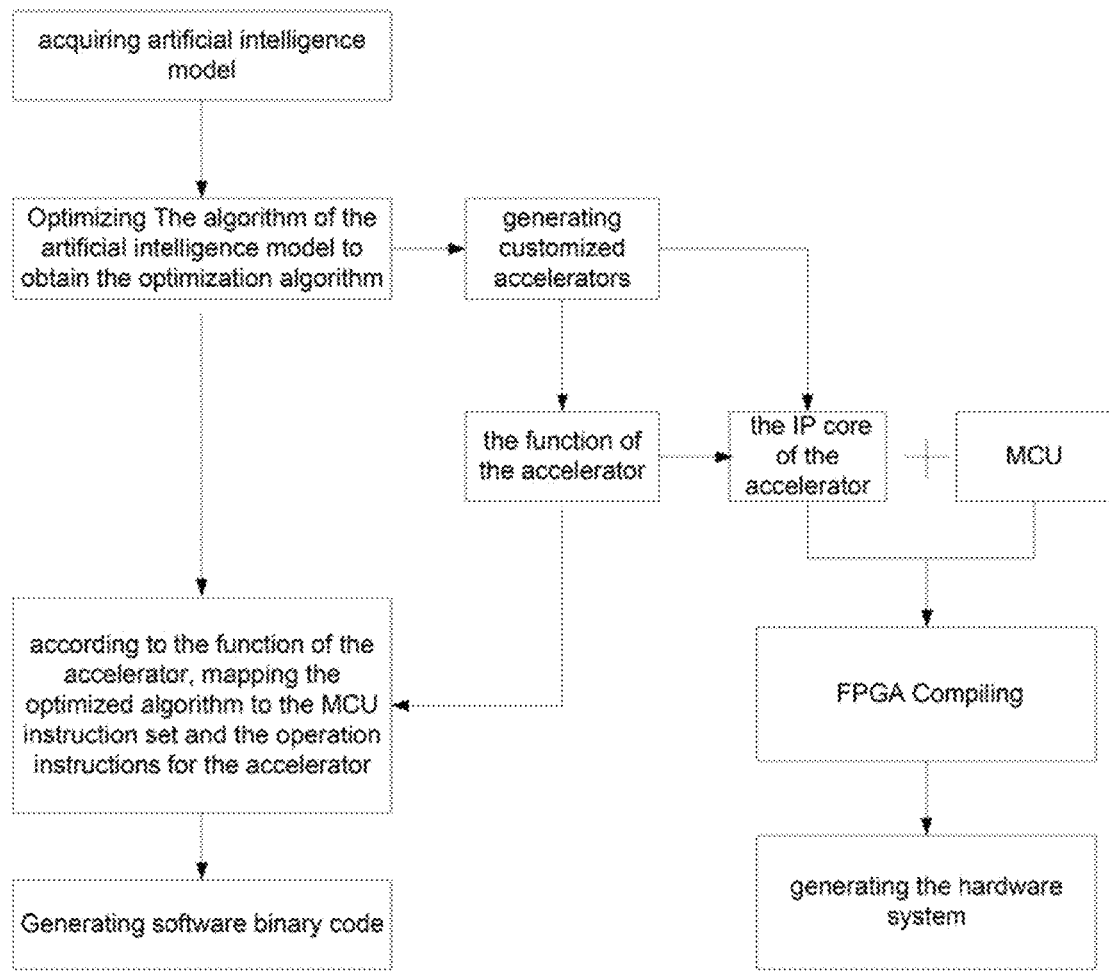
FIG. 6 is a flow chart of a compilation method according to one embodiment of the present application.

FIG. 6 is a flow chart of a compilation method in accordance with one embodiment of the present application. The compiler tool chain can be seen as an extension of the existing MCU-based AI tool chain. After the AI model and algorithm are optimized, the function of accelerator is determined. On the one hand, the hardware system is compiled and generated by FPGA. On the other hand, the algorithm is mapped to MCU instruction set and the operation of accelerator to generate software binary code.

Specifically, the compilation method includes the following steps:

S11, acquiring AI model. Generally, it can be obtained by reading the results of an AI modeling software.

S12, optimizing the algorithm of the AI model to obtain the optimized algorithm. Algorithmic level optimization mainly aims at the deep learning model itself. It uses such methods as hyper-parameter setting, network structure tailoring and quantification to reduce the size of the model and the amount of computation, thus speeding up the reasoning process. The hyper-parameter setting, network structure tailoring and quantization mentioned above can be used as examples of algorithm optimization for model.

S13, generating a customized accelerator. In determining the function of the accelerator, the characteristics of specific AI algorithms (such as data bit width, common operations, etc.) and the given hardware resource constraints can be considered to give the best balance scheme. The IP core corresponding to the accelerator function is selected/configured and added to the hardware design of the FPGA.

S14, according to the function of accelerator, mapping the optimized algorithm to the MCU instruction set and operation instructions for the accelerator, and generating the software binary code.

S15, according to the function of accelerator, compiling the P core of the accelerator and the MCU by the FPGA to generate hardware system.

Further, in one embodiment, according to the accelerator function, mapping the optimized algorithm to the MCU instruction set and operation instructions for the accelerator includes:

Reading and analyzing the algorithm of the AI model by a compiler, and

Extracting an acceleratable part of the algorithm and implementing the acceleratable part by the accelerator, and implementing the remaining part by the MCU instruction set.

Further, the accelerator function can be expressed as an extended instruction set of the MCU or as peripheral function of the MCU.

On the other hand, the present application also provides a computer-readable medium which may be included in the electronic device described in the above-mentioned embodiment or may exist alone without being assembled into the electronic device. When one or more of the above programs are executed by one of the electronic devices, the computer-readable medium carries one or more programs, which enables the electronic device to realize the compilation method as described in the above embodiment.

For example, the electronic device can achieve the steps shown in FIG. 6: S11, acquiring AI model; S12, optimizing the algorithm of the AI model to obtain the optimized algorithm; S13, generating the customized accelerator, S14, according to the function of accelerator, mapping the optimized algorithm to the MCU instruction set and operation instructions for the accelerator, and generating the software binary code is generated; and S15, according to the function of accelerator, compiling the IP core of the accelerator and the MCU by the FPGA to generate the hardware system.

Figure 7:
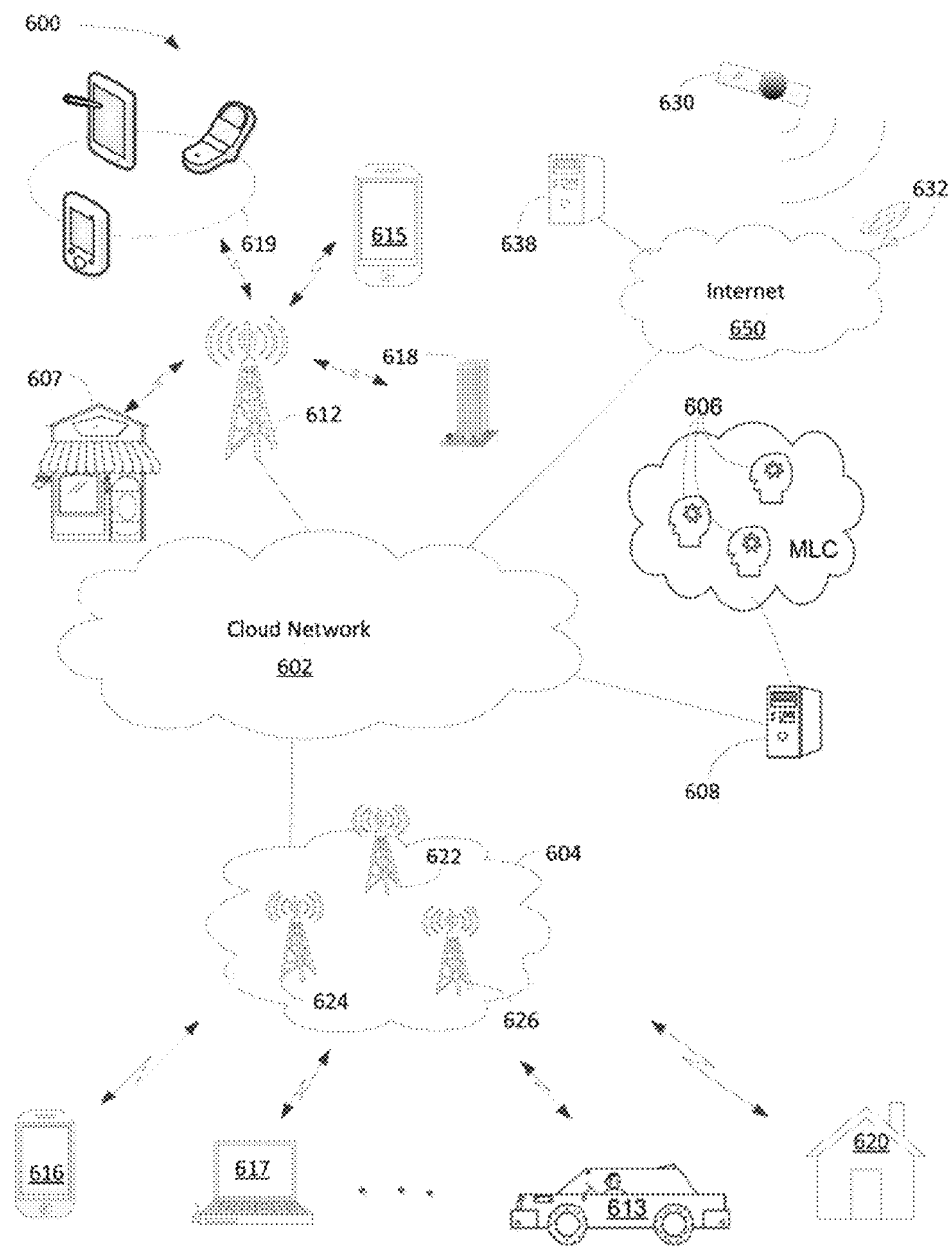
FIG. 7 is a block diagram illustrating various applications of EAIC system based on SoC FPGA connected to a cloud-based communication network according to one embodiment of the present application.

FIG. 7 is a block diagram illustrating various applications of EAIC system based on SoC FPGA connected to a cloud-based communication network according to one embodiment of the present application. Diagram 600 illustrates AI server 608, communication network 602, switching network 604, Internet 650, and portable electric devices 613-619. In one aspect, low-power PSD can be used in AI server, portable electric devices, and/or switching network. Network or cloud network 602 can be wide area network ("WAN"), metropolitan area network ("MAN"), local area network ("IAN"), satellite/terrestrial network, or a combination of WAN, MAN, and LAN. It should be noted that the underlying concept of the exemplary embodiment(s) of the present invention would not change if one or more blocks (or networks) were added to or removed from diagram 600.

Network 602 includes multiple network nodes, not shown in FIG. 7, wherein each node may include mobility management entity ("MME"), radio network controller ("RNC"), serving gateway ("S-GW"), packet data network gateway ("P-GW"), or Home Agent to provide various network functions. Network 602 is coupled to Internet 650, AI server 608, base station 612, and switching network 604. Server 608, in one embodiment, includes machine learning computers ("ML") 606 using partitioned PSD with DRPC for power conservation.

Switching network 604, which can be referred to as packet core network, includes cell sites 622-626 capable of providing radio access communication, such as 3G (3rd generation), 40, or SG cellular networks. Switching network 604, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 604 is logically coupling multiple users and/or mobiles 616-620 across a geographic area via cellular and/or wireless networks. It should be noted that the geographic area may refer to a campus, city, metropolitan area, country, continent, or the like.

Base station 612, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 615, laptop computer 617, iPhone® 616, tablets and/or iPad® 619 via wireless communications. Handheld device can also be a smartphone, such as iPhone®, BlackBerry®, Android, and so on. Base station 612, in one example, facilitates network communication between mobile devices such as portable handheld device 613-619 via wired and wireless communications networks. It should be noted that base station 612 may include additional radio towers as well as other land switching circuitry.

Internet 650 is a computing network using Transmission Control Protocol/Internet Protocol ("TCP/IP") to provide linkage between geographically separated devices for communication. Internet 650, in one example, couples to supplier server 638 and satellite network 630 via satellite receiver 632. Satellite network 630, in one example, can provide many functions as wireless communication as well as global positioning system ("GPS"). In one aspect, partitioned PSD with DRPC can be used in all applicable devices, such as, but not limited to, smartphones 613-619, satellite network 630, automobiles 613, AI server 608, business 607, and homes 620.

The above description involves various modules. These modules usually include hardware and/or a combination of hardware and software (e.g., solidified software). These modules may also include computer-readable media (e.g., permanent media) containing instructions (e.g., software instructions), which, when executed by a processor, can perform various functional features of the present invention.

Accordingly, unless explicitly required, the scope of the present invention is not limited by specific hardware and/or software characteristics of the modules explicitly mentioned in the embodiments. As a non-limiting example, the present invention can execute software instructions (e.g., stored in non-permanent memory and/or permanent memory) by one or more processors (e.g., microprocessors, digital signal processors, baseband processors, and microcontrollers) in an embodiment. In addition, the present invention can also be implemented with an application specific integrated circuit (ASIC) and/or other hardware components. It should be pointed out that the system/device is divided into various modules for clarity. However, in practice, the boundaries of various modules can be blurred. For example, any or all functional modules in this article can share various hardware and/or software components. For example, any and/or all of the functional modules in this paper can be implemented wholly or partially by executing software instructions by a common processor. In addition, various software sub-modules executed by one or more processors can be shared among various software modules. Accordingly, the scope of the present invention is not limited by mandatory boundaries between various hardware and/or Software Components Unless explicitly required.

What has been disclosed above is only a better embodiment of the present invention. Of course, the scope of the present invention can not be limited by this. One of ordinary skill in the art can understand all or part of the process for realizing the above-mentioned embodiment, and the equivalent changes made according to the claims of the invention still fall within the scope of the invention.

What is claimed is:

1. A compilation method for a system architecture based on system on chip (SoC) field programmable gate array (FPGA) for edge artificial intelligence (AI) computing, the system architecture including a microcontroller unit (MCU) subsystem, which comprises an MCU and a memory, and an FPGA subsystem, the compilation method comprising:
   acquiring an AI model;
   optimizing an algorithm of the AI model to obtain an optimized algorithm;
   generating a customized accelerator in the FPGA subsystem;
   mapping, according to a function of the accelerator, the optimized algorithm to an MCU instruction set for the MCU of the MCU subsystem and operation instructions for the accelerator of the FPGA subsystem, and generating a software binary code; and
   compiling, according to the function of the accelerator, an intellectual property (IP) core of the accelerator and the MCU by the FPGA to generate a hardware system,
   wherein a shared memory is configured in the FPGA subsystem and is separate from the memory of the MCU subsystem, and wherein the MCU subsystem and the accelerator are directly connected with the shared memory for individual direct access of the shared memory.

2. The compilation method of claim 1, wherein mapping, according to the function of the accelerator, the optimized algorithm to the MCU instruction set and the operation instructions for the accelerator comprises:
   reading and analyzing the algorithm of the AI model; and
   extracting an acceleratable part of the algorithm and implementing the acceleratable part by the accelerator, and implementing a remaining part of the algorithm by the MCU instruction set.

3. The compilation method of claim 2, wherein the function of the accelerator is represented as an extended instruction set of the MCU or as a peripheral function of the MCU.

* * * * *